US009938621B2

(12) United States Patent
Mitrovic et al.

(10) Patent No.: US 9,938,621 B2
(45) Date of Patent: Apr. 10, 2018

(54) METHODS OF WAFER PROCESSING WITH CARRIER EXTENSION

(71) Applicant: Veeco Instruments Inc., Plainview, NY (US)

(72) Inventors: Bojan Mitrovic, Somerset, NJ (US); Guanghua Wei, Dayton, NJ (US); Eric A. Armour, Pennington, NJ (US); Ajit Paranjpe, Basking Ridge, NJ (US)

(73) Assignee: Veeco Instruments Inc., Plainview, NY (US)

( * ) Notice: Subject to any disclaimer, the term of this patent is extended or adjusted under 35 U.S.C. 154(b) by 0 days.

(21) Appl. No.: 15/151,845

(22) Filed: May 11, 2016

(65) Prior Publication Data

US 2016/0251758 A1 Sep. 1, 2016

Related U.S. Application Data

(62) Division of application No. 13/333,152, filed on Dec. 21, 2011.
(Continued)

(51) Int. Cl.
*C23C 16/455* (2006.01)
*C23C 16/458* (2006.01)
(Continued)

(52) U.S. Cl.
CPC ...... *C23C 16/4585* (2013.01); *C23C 16/4584* (2013.01); *C23C 16/45504* (2013.01);
(Continued)

(58) Field of Classification Search
CPC .......................... C23C 16/455; C23C 16/4409
See application file for complete search history.

(56) References Cited

U.S. PATENT DOCUMENTS 4,770,680 A * 9/1988 Machida .............. B65G 1/0471
414/940
5,152,842 A 10/1992 Urata et al.
(Continued)

FOREIGN PATENT DOCUMENTS

CN 101448971 A 6/2009
CN 101495675 A 7/2009
(Continued)

OTHER PUBLICATIONS

Bouteville, a., "Numerical Simulation Applied to Chemical Vapour Deposition Process. Rapid Thermal Cvd and Spray Cvd". Journal of Optoelectronics and Advanced Materials, vol. 7, no. 2, Apr. 2005, pp. 599-606.*
(Continued)

*Primary Examiner* — Bret P Chen
(74) *Attorney, Agent, or Firm* — Lerner, David, Littenberg, Krumholz & Mentlik, LLP

(57) ABSTRACT

Methods are provided for treating wafers using a wafer carrier rotated about an axis. The wafer carrier is provided with a ring which surrounds the wafer carrier during operation. Treatment gasses directed onto a top surface of the carrier flow outwardly away from the axis over the carrier and over the ring, and pass downstream outside of the ring. The outwardly flowing gasses form a boundary over the carrier and ring. The ring helps to maintain a boundary layer of substantially uniform thickness over the carrier, which promotes uniform treatment of the wafers.

12 Claims, 7 Drawing Sheets

Related U.S. Application Data

(60) Provisional application No. 61/428,250, filed on Dec. 30, 2010.

(51) Int. Cl.
*H01L 21/687* (2006.01)
*C30B 25/16* (2006.01)
*C30B 29/06* (2006.01)
*C23C 16/46* (2006.01)
*H01L 21/02* (2006.01)

(52) U.S. Cl.
CPC .. *C23C 16/45508* (2013.01); *C23C 16/45591* (2013.01); *C23C 16/46* (2013.01); *C30B 25/165* (2013.01); *C30B 29/06* (2013.01); *H01L 21/0254* (2013.01); *H01L 21/0262* (2013.01); *H01L 21/68735* (2013.01); *H01L 21/68764* (2013.01); *H01L 21/68771* (2013.01); *H01L 21/68785* (2013.01)

(56) References Cited

U.S. PATENT DOCUMENTS

| | | | |
|---|---|---|---|
| 5,284,789 A * | 2/1994 | Mori | H01L 21/02164 257/E21.279 |
| 5,884,009 A | 3/1999 | Okase | |
| 6,074,518 A | 6/2000 | Imafuku et al. | |
| 6,213,478 B1 | 4/2001 | Nishikawa | |
| 6,261,408 B1 | 7/2001 | Schneider et al. | |
| 6,419,751 B1 | 7/2002 | Nagashima | |
| 6,478,872 B1 * | 11/2002 | Chae | C23C 16/45548 117/105 |
| 6,531,069 B1 | 3/2003 | Srivastava et al. | |
| 6,590,186 B2 | 7/2003 | Tanaka et al. | |
| 6,716,287 B1 * | 4/2004 | Santiago | C23C 16/4412 118/728 |
| 6,800,173 B2 * | 10/2004 | Chiang | C23C 16/0227 118/715 |
| 6,902,623 B2 | 6/2005 | Gurary et al. | |
| 7,070,660 B2 | 7/2006 | Keeton et al. | |
| 7,276,124 B2 | 10/2007 | Gurary et al. | |
| 7,865,995 B2 | 1/2011 | Mayer | |
| 8,387,194 B2 | 3/2013 | Mayer | |
| 8,460,466 B2 | 6/2013 | Gurary | |
| 2002/0185068 A1 * | 12/2002 | Gurary | C23C 16/4401 118/722 |
| 2005/0011459 A1 * | 1/2005 | Liu | C23C 16/45504 118/728 |
| 2005/0070105 A1 * | 3/2005 | Bailey, III | H01J 37/32522 438/689 |
| 2007/0251458 A1 | 11/2007 | Mund et al. | |
| 2007/0264840 A1 | 11/2007 | Itatani et al. | |
| 2007/0269983 A1 | 11/2007 | Sneh | |
| 2008/0057197 A1 | 3/2008 | Liu | |
| 2008/0236497 A1 | 10/2008 | Vukovic et al. | |
| 2009/0139453 A1 * | 6/2009 | Chen | C23C 16/36 118/723 I |
| 2009/0155028 A1 | 6/2009 | Boguslayskiy et al. | |
| 2010/0047450 A1 * | 2/2010 | Li | C23C 16/4412 427/255.28 |
| 2010/0124610 A1 | 5/2010 | Aikawa et al. | |
| 2010/0206231 A1 | 8/2010 | Yoon et al. | |
| 2011/0215071 A1 | 9/2011 | Mitrovic et al. | |
| 2012/0027936 A1 | 2/2012 | Gurary | |
| 2012/0171870 A1 | 7/2012 | Mitrovic et al. | |
| 2013/0298831 A1 | 11/2013 | Shamoun et al. | |

FOREIGN PATENT DOCUMENTS

| | | |
|---|---|---|
| EP | 0272140 A2 | 6/1988 |
| JP | 63-020464 | 1/1988 |
| JP | H02146165 U | 12/1990 |
| JP | 05-051294 | 3/1993 |
| JP | 05202474 A | 8/1993 |
| JP | 05263249 | 10/1993 |
| JP | H05263249 A | 10/1993 |
| JP | 07-106096 | 4/1995 |
| JP | 07-201778 | 8/1995 |
| JP | 09-082653 | 3/1997 |
| JP | 09-186111 | 7/1997 |
| JP | 11-158632 | 6/1999 |
| JP | 03063573 U | 11/1999 |
| JP | 2000058529 A | 2/2000 |
| JP | 2000216097 A | 8/2000 |
| JP | 2003234300 A | 8/2003 |
| JP | 2004-173470 A | 6/2004 |
| JP | 2005251988 A | 9/2005 |
| JP | 2005353665 A | 12/2005 |
| JP | 2007531250 A | 11/2007 |
| JP | 2008506849 A | 3/2008 |
| JP | 2008252106 A | 10/2008 |
| JP | 2009064850 A | 3/2009 |
| JP | 2010109297 A | 5/2010 |
| JP | 2010153769 A | 7/2010 |
| JP | 2010202982 A | 9/2010 |
| JP | 2010538489 A | 12/2010 |
| KR | 20030018074 A | 3/2003 |
| TW | 200804619 A | 1/2008 |
| TW | 200905010 A | 2/2009 |
| TW | 201023258 A | 6/2010 |
| TW | 201030179 A | 8/2010 |
| WO | 2005010227 A2 | 2/2005 |
| WO | 2009049020 A2 | 4/2009 |
| WO | 2009148913 A2 | 12/2009 |

OTHER PUBLICATIONS

International Search Report and Wirtten Opinion for Application No. PCT/US2011/066489 dated Apr. 26, 2012.
International Search Report and Written Opinion Application No. PCT/US2011/046215, dated Oct. 19, 2011.
Japanese Office Action for Application No. JP 2013-523263 dated Jan. 6, 2015.
Singapore Examination Report for Application No. 2013007018 dated Jun. 20, 2014.
Taiwan Search Report for Application No. 100149862 dated Apr. 24, 2014.
Taiwanese Office Action for Applicaion No. 100149862 dated Aug. 13, 2014.
Walker R et al: "Novel high temperature metal organic chemical vapor deposition vertical rotating-disk reactor with multizone heating for GaN and related materials", Materials Science and Engineering B. Elsevier Sequoia, Lausanne. CH, vol. 35. No. 1, Dec. 1, 1995 (Dec. 1, 1995), pp. 97-101, XP004000684, ISSN: 0921-5107. DOI:10.1016/0921-5107(95)01366-0.

* cited by examiner

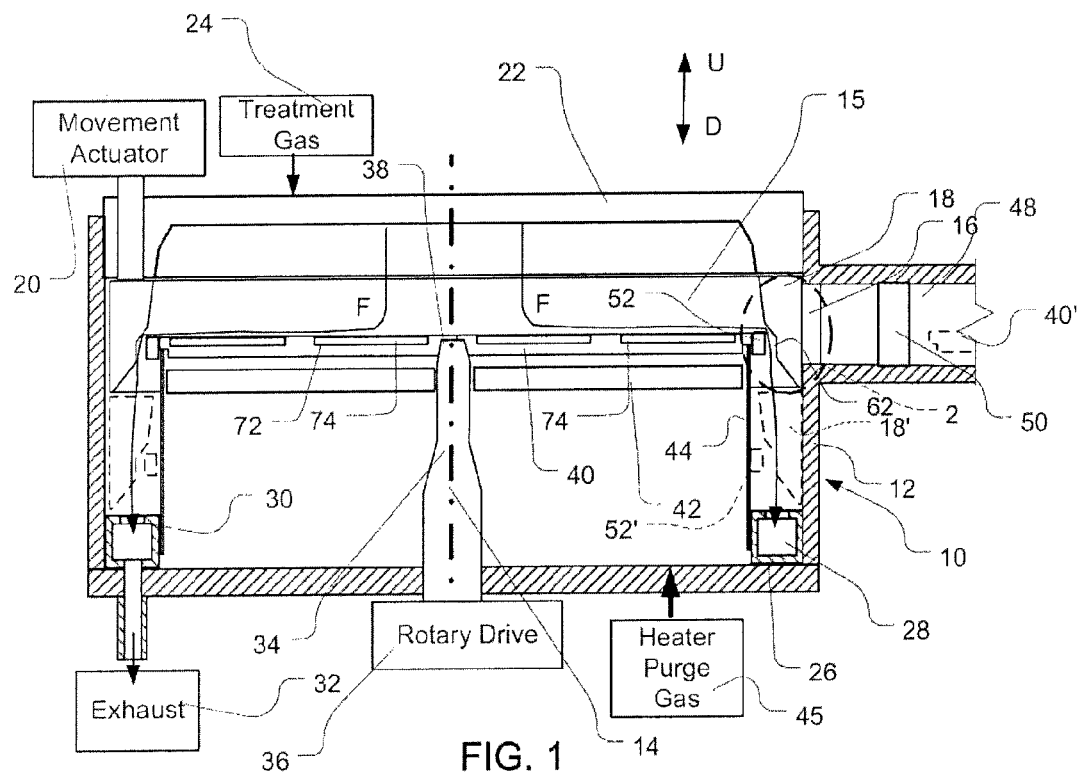
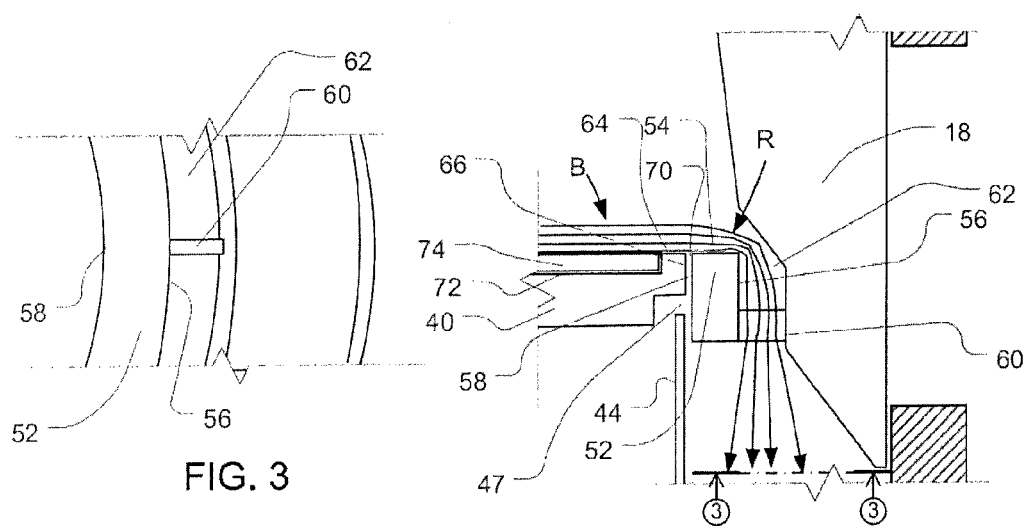

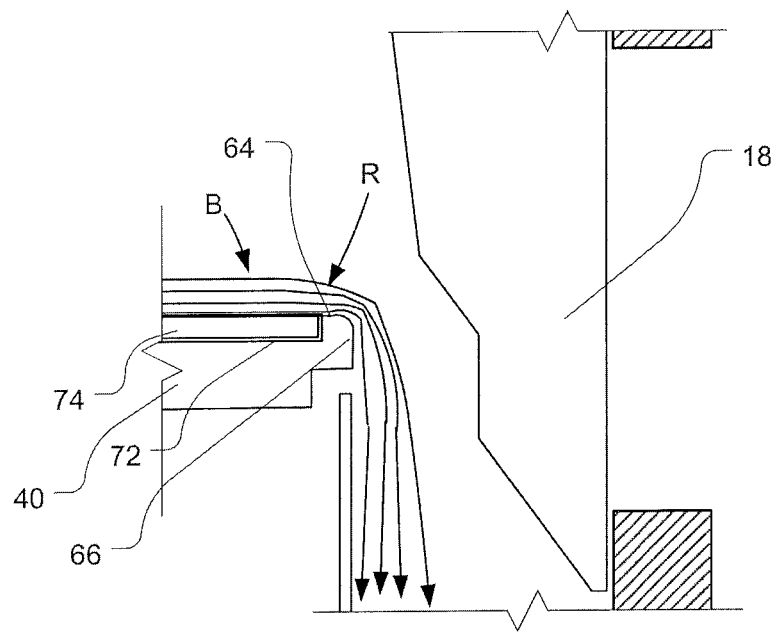
FIG. 4 - Prior Art
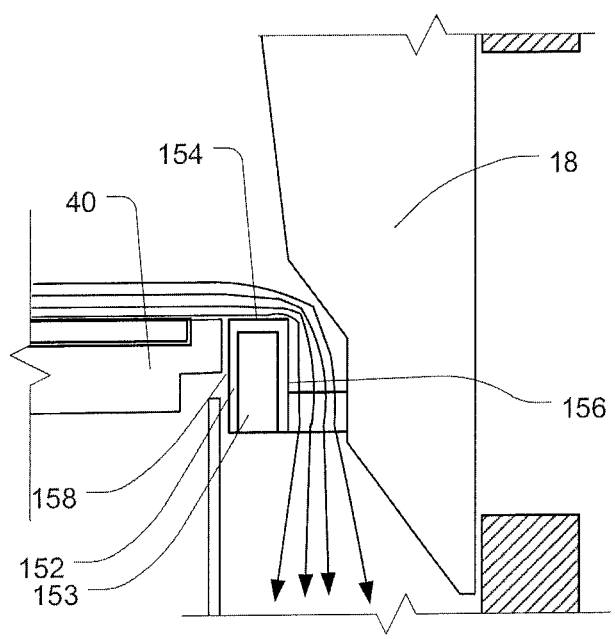
FIG. 6

METHODS OF WAFER PROCESSING WITH CARRIER EXTENSION

CROSS-REFERENCE TO RELATED APPLICATIONS

This application is a divisional of U.S. application Ser. No. 13/333,152, filed Dec. 21, 2011, which claims the benefit of the filing date of U.S. Provisional Application No. 61/428,250, filed Dec. 30, 2010, all of which are incorporated herein by reference.

BACKGROUND OF THE INVENTION

The present invention relates to wafer processing apparatus, to wafer carriers for use in such processing apparatus, and to methods of wafer processing.

Many semiconductor devices are formed by processes performed on a substrate. The substrate typically is slab of a crystalline material, commonly referred to as a "wafer." Typically, the wafer is formed from a crystalline material, and is in the form of a disc. One common process is epitaxial growth. For example, devices formed from compound semiconductors such as III-V semiconductors typically are formed by growing successive layers of the compound semiconductor using metal organic chemical vapor deposition or "MOCVD." In this process, the wafers are exposed to a combination of gases, typically including a metal organic compound as a source of a group III metal, and also including a source of a group V element, which flow over the surface of the wafer while the wafer is maintained at an elevated temperature. Typically, the metal organic compound and group V source are combined with a carrier gas which does not participate appreciably in the reaction as, for example, nitrogen. One example of a III-V semiconductor is gallium nitride, which can be formed by reaction of an organo gallium compound and ammonia on a substrate having a suitable crystal lattice spacing, as, for example, a sapphire wafer. Typically, the wafer is maintained at a temperature on the order of 1000-1100° C. during deposition of gallium nitride and related compounds.

Composite devices can be fabricated by depositing numerous layers in succession on the surface of the wafer under slightly different reaction conditions, as, for example, additions of other group III or group V elements to vary the crystal structure and bandgap of the semiconductor. For example, in a gallium nitride based semiconductor, indium, aluminum or both can be used in varying proportion to vary the bandgap of the semiconductor. Also, p-type or n-type dopants can be added to control the conductivity of each layer. After all of the semiconductor layers have been formed and, typically, after appropriate electric contacts have been applied, the wafer is cut into individual devices. Devices such as light-emitting diodes ("LEDs"), lasers, and other optoelectronic devices can be fabricated in this way.

In a typical chemical vapor deposition process, numerous wafers are held on a device commonly referred to as a wafer carrier so that a top surface of each wafer is exposed at the top surface of the wafer carrier. The wafer carrier is then placed into a reaction chamber and maintained at the desired temperature while the gas mixture flows over the surface of the wafer carrier. It is important to maintain uniform conditions at all points on the top surfaces of the various wafers on the carrier during the process. Variations in process conditions can cause undesired variations in the properties of the resulting semiconductor device. For example, variations in the rate of deposition can cause variations in thickness of the deposited layers, which in turn can lead to non-uniform characteristics in the resulting devices. Thus, considerable effort has been devoted in the art heretofore towards maintaining uniform conditions.

One type of CVD apparatus which has been widely accepted in the industry uses a wafer carrier in the form of a large disc with numerous wafer-holding regions, each adapted to hold one wafer. The wafer carrier is supported on a spindle within the reaction chamber so that the top surface of the wafer carrier having the exposed surfaces of the wafers faces upwardly toward a gas distribution element. While the spindle is rotated, the gas is directed downwardly onto the top surface of the wafer carrier and flows across the top surface toward the periphery of the wafer carrier. The outwardly-flowing gas forms a boundary layer covering the top surface of the wafer carrier. The used gas flows downwardly around the periphery of the wafer and is evacuated from the reaction chamber through ports disposed below the wafer carrier. The wafer carrier is maintained at the desired elevated temperature by heating elements, typically electrical resistive heating elements disposed below the bottom surface of the wafer carrier.

The rate of certain treatment processes, such as the growth rate in an MOCVD process under mass-transport-limited growth conditions, is inversely related to the boundary layer thickness. For the case of an infinitely large carrier, theory predicts that the rate is inversely proportional to the boundary layer thickness. This means that for thinner boundary layers the growth rate is higher. This reflects the fact that, as the boundary layer becomes thinner, it takes less time for reactive moieties to diffuse through the boundary layer to the surface of the wafer carrier and the surfaces of the wafers. Hence, a thin and uniform diffusion boundary layer is desirable to achieve uniform and fast deposition rate during the MOCVD epitaxial growth. Boundary layer thickness can be controlled by changing the rotation rate and pressure in reactor and is inversely proportional of the square root of those two parameters. It can also be controlled by changing the dynamic viscosity of the gas mixture. The dynamic viscosity is a function of fraction of different gases in the mixture as well as of carrier and inlet temperature.

Typically, with stable flow conditions in the reactor and with substantially uniform heating of the wafer carrier, uniform boundary layer thickness can be achieved above the majority of the wafer carrier surface. However, near the periphery of the wafer carrier, the gas flow begins to change direction from radial above the wafer carrier to the downward flow which carries the gas from the wafer carrier to the exhaust. In the edge region of the wafer carrier near the periphery, the boundary layer becomes thinner and hence the process rate increases appreciably. For example, if a wafer is positioned on the carrier with a portion of the wafer disposed in the edge region, a chemical vapor deposition process will form layers of uneven thickness. Thicker portions will be formed on those parts of the wafer disposed in the edge region.

To avoid this problem, wafers are not positioned in the edge region. Thus, the pockets or other wafer-holding features of wafer carriers typically are provided only in the area of the wafer carrier remote from the periphery. This limits the number and size of wafers which can be accommodated on a carrier of a given size, and therefore limits the productivity of the equipment and process. Although a larger wafer carrier could accommodate more wafers, larger carriers have significant drawbacks. Larger carriers are more expensive, heavier and thus more difficult to handle, particularly during movement of the carrier into and out of the reaction chamber. Moreover, it typically is impractical to increase the size of the wafer carriers used in existing processing equipment.

Thus, although considerable effort has been devoted in the art heretofore to design an optimization of such systems, still further improvement would be desirable.

SUMMARY OF THE INVENTION

One aspect of the invention provides a reactor. The reactor according to this aspect of the invention desirably includes a chamber having a wall structure defining an interior surface. The reactor preferably has a spindle disposed within the chamber and rotatable about an upstream-to-downstream axis, the spindle being adapted to support a wafer carrier for rotation about the axis so that a top surface of the carrier faces in the upstream direction at a carrier location. The reactor according to this aspect of the invention preferably also includes a ring mounted within the chamber, the ring having a top surface facing in the upstream direction, the ring being constructed and arranged so that when the reactor is in an operative condition, the ring closely surrounds the wafer carrier supported on the spindle and the top surface of the ring is substantially continuous with the top surface of the carrier. The ring typically is movably mounted within the chamber, so that it does not impede loading or unloading of carriers.

Typically, the reactor also includes a gas inlet element communicating with the chamber upstream of the carrier location and a gas exhaust communicating with the chamber downstream of the carrier location. The ring typically has a peripheral surface facing outwardly away from the axis, the ring being arranged so that when the reactor is in an operative condition, there is a gap between the peripheral surface of the ring and the interior surface of the chamber. As further discussed below, during operation of the reactor, gas discharged from the gas inlet element flows downstream toward the wafer carrier and over the top surface of the carrier and wafers held on the carrier, and flows outwardly over the ring. In effect, the ring forms an extension of the carrier, so the gas flow is similar to that which would be obtained with a carrier of larger diameter. The boundary layer may have substantially uniform thickness over the entire carrier, or over almost the entire carrier, so that wafer parts or wafers can be positioned in edge regions of the carrier.

A further aspect of the invention provides methods of processing wafers. The method according to this aspect of the invention desirably includes the step positioning a wafer carrier inside a reaction chamber so that a ring within the chamber surrounds the carrier, so that top surfaces of the carrier and ring facing in an upstream direction are substantially continuous with one another and so that surfaces of wafers disposed on the carrier face in the upstream direction. The method preferably also includes the step of directing one or more treatment gasses in a downstream direction onto the top surfaces of the wafer carrier and wafers while rotating the wafer carrier and wafers around an upstream-to-downstream axis, so that the treatment gasses flow outwardly over the top surface of the carrier and the surfaces of the wafer, and flow outwardly from the top surface of the carrier over the top surface of the ring. The method typically further includes exhausting gasses from the chamber downstream from the ring so that the gasses flowing outwardly over the top surface of the ring pass downstream within a gap between the ring and a wall of the chamber.

Yet another aspect of the invention provides wafer carriers. Wafer carriers according to this aspect of the invention desirably include a body having a circular top surface, a peripheral surface bounding the top surface and a fitting adapted to engage a spindle of a wafer processing reactor so that the top surface and peripheral surface are concentric with the spindle. The body desirably further defines a plurality of pockets each adapted to hold a wafer, the pockets including outer pockets adapted to hold wafers so that portions of the wafers lie within about 5 mm of the peripheral surface.

BRIEF DESCRIPTION OF THE DRAWINGS

A more complete appreciation of the subject matter of the present invention and of the various advantages thereof can be realized by reference to the following detailed description in which reference is made to the accompanying drawings in which:

FIG. 1 is a diagrammatic sectional view of apparatus according to one embodiment of the invention.

FIG. 2 is a fragmentary view of the region indicated at 2 in FIG. 1.

FIG. 3 is a fragmentary view taken along line 3-3 in FIG. 2.

FIG. 4 is a view similar to FIG. 2, but depicting a portion of conventional apparatus according to the prior art.

FIG. 6 is a view similar to FIG. 2, but depicting a portion of apparatus according to a further embodiment of the invention.

DETAILED DESCRIPTION

Figure 5:
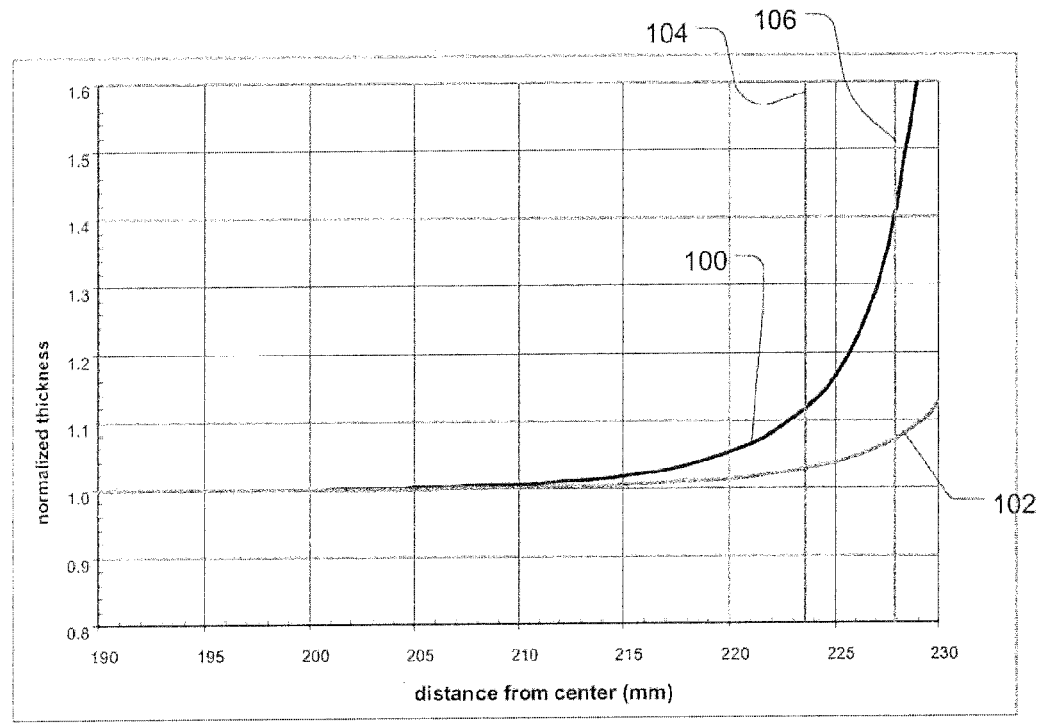
FIG. 5 is a graph of predicted performance for apparatus according to FIGS. 1-3 and for the apparatus of FIG. 4.

In describing the preferred embodiments of the subject illustrated and to be described with respect to the drawings, specific terminology will be used for the sake of clarity. However, the invention is not intended to be limited to any specific terms used herein, and it is to be understood that each specific term includes all technical equivalents, which operate in a similar manner to accomplish a similar purpose.

Apparatus according to one embodiment of the invention incorporates a reaction chamber 10 having a wall structure which incorporates a fixed wall 12 defining a generally cylindrical space 15 having a central axis 14 and an opening 16 communicating with the interior space. As further discussed below, gas flow within the reaction chamber during operation is generally from the region at the top of the drawing in FIG. 1 toward the region at the bottom of the drawing. Therefore, the direction along the axis toward the bottom of the drawing, indicated by arrow D in FIG. 1, is referred to herein as the "downstream" direction, and the opposite direction denoted by arrow U is referred to herein as the "upstream" direction.

The wall structure of the chamber further includes a ring-like shutter 18. The shutter 18 has a central axis coincident with the central axis 14. Shutter 18 is mounted for movement relative to the fixed wall in the upstream and downstream directions and is connected to a movement actuator 20. Actuator 20 is arranged to move the shutter between the operative position illustrated in solid lines in FIG. 1 and the open position depicted in broken lines at 18' in FIG. 1. When shutter 18 is in the operative position, it covers opening 16. Typically, shutter 18 does not form a gas-tight seal at opening 16. Fixed wall 12 and shutter 18 are provided with coolant passages (not shown) inside the walls or on their exterior surfaces. The coolant passages are connected to a coolant supply apparatus (not shown), so that the fixed wall and shutter can be maintained at desired temperatures during the process.

A gas inlet element 22 is provided at an upstream end of chamber 10, towards the top of the drawing in FIG. 1. The gas inlet element is connected to one or more sources 24 arranged to supply one or more treatment gases. Gas inlet element 22 may be generally conventional and may be arranged to discharge the treatment gases in a flow directed generally in the downstream direction D. The gas inlet element typically is arranged to discharge the treatment gases in a pattern of discharges spaced around central axis 14 and distributed at various radial distances from the central axis. The gas inlet element typically is also provided with coolant channels (not shown) for maintaining its temperature during the process.

A hollow hoop-like exhaust manifold 26 is provided adjacent the downstream end of the chamber. The exhaust manifold has an interior passage 28 and numerous ports 30 open to the interior of the chamber. The interior passage 28 of the exhaust manifold, in turn, is connected to an exhaust system 32 arranged to pump gases out of the interior space 15 and discharge the gases to waste.

A spindle 34 is mounted to the fixed wall structure 12 for rotation about central axis 14. Spindle 34 is connected to a rotary drive mechanism 36. The spindle has a fitting 38 at its upstream end. The fitting is arranged to releasably engage and hold a wafer carrier 40 at the carrier location depicted in FIG. 1. The carrier location is disposed downstream from gas inlet element 22, but upstream from exhaust manifold 26. A heater 42 is disposed downstream from the carrier location and surrounds spindle 34. Heater 42 is supported within the chamber by supports (not shown) fixed to the fixed wall structure 12. A circular baffle 44 surrounds the heater and extends downstream from the carrier location. A source 45 of a heater purge gas communicates with the space inside of baffle 44. As best seen in FIG. 2, the baffle is dimensioned so that, when a wafer carrier 40 is mounted at the carrier location, there is a small gap 47 between the baffle and the carrier. During operation, the heater purge gas source 45 feeds a purge gas, such as nitrogen, into the space within baffle 44 so that the purge gas flows out of this space through gap 47 and passes to exhaust 32 along with the other gas flows discussed below. The heater purge gas prevents the treatment gas from contacting and attacking heater 42.

An antechamber 48 communicates with opening 16 in the fixed wall structure. Antechamber 48 is provided with a closure, such as a gate valve element 50, schematically shown in FIG. 1. The gate valve element is arranged to seal the antechamber and thus block communication between antechamber 48 and the interior space 15. Valve element 50 can be moved to a retracted position (not shown) to allow communication between the antechamber and interior space 15. When the valve element is in the retracted position and shutter 18 is in the open position 18', a wafer carrier 40 can be removed from its engagement with fitting 38 of the spindle and moved through opening 16 into the antechamber using robotic handling apparatus (not shown). A new wafer carrier 40' can be moved from the antechamber into the reaction chamber and engaged with fitting 38 so that the new wafer carrier is positioned at the carrier location.

A ring 52 is mounted to shutter 18 and thus positioned within the interior space 15 of the chamber. As best seen in FIGS. 2 and 3, ring 52 has a top surface 54 facing in the upstream direction; an outer circumferential surface 56 facing radially outwardly, away from the central axis; and an inner surface 58 facing radially inwardly, toward the central axis. Ring 52 is mounted to shutter 18 by struts 60 disposed around the circumference of the chamber. One such strut is depicted in FIGS. 2 and 3. The struts are disposed below top surface 54. The outer peripheral surface 56 of the ring is disposed radially in-board of the adjacent surface of shutter 18, so that there is a gap 62 between the surface of the shutter and the ring. For example, in apparatus arranged to hold a 465 mm diameter wafer carrier, the width of gap 62 at its narrowest point may be on the order of 13 mm. Because struts 60 are relatively thin, they do not materially obstruct gap 62. The dimensions of ring 52 and its mounting to shutter 18 are selected so that when the shutter 18 is in an operative condition, as shown in solid lines in FIG. 1 and as depicted in FIG. 2, and when a wafer carrier 40 is disposed in an operative condition and positioned at the carrier location in engagement with fitting 38 on spindle 34, the top surface 54 of the ring is substantially coplanar with the top or upstream surface 64 of the carrier 40. The width or radial extent of ring 52 desirably may be about 13-15 mm, and still greater ring widths are more desirable. In general, ring 52 should be as wide as is practicable. Where the ring is to be fitted into existing systems originally built without the ring, the ring width is limited by the need to provide a gap 62 of sufficient width.

Also, ring 52 is dimensioned and mounted so that in this operative condition, the interior surface 58 of the ring lies adjacent the exterior peripheral surface 66 of the wafer carrier 40, leaving only a small gap 70 between the surfaces. Desirably, gap 70 is as small as practicable, consistent with manufacturing tolerances and allowances for differential thermal expansion of the components. For example, gap 70 may be about 2 mm wide or less. Preferably, the cross-sectional area of gap 70 is less than about 5% of the cross-sectional area of gap 62 between the exterior peripheral surface of the ring and the shutter 18, as measured at the narrowest point of gap 62.

As best seen in FIGS. 1 and 2, each wafer carrier 40 defines numerous pockets 72, each of which is arranged to hold a wafer 74 so that a top surface of the wafer is substantially coplanar with the top surface 64 of the carrier. Desirably, wafer carrier 40 has a relatively sharp edge at the juncture of its top surface 64 and peripheral surface 66, and ring 52 desirably also has sharp edges at the juncture of its top surface with interior surface 58 and exterior peripheral surface 56. These sharp edges desirably have radii less than about 0.1 mm.

In operation, the apparatus is brought to the operative condition depicted in FIGS. 1-3, with a wafer carrier 40 bearing wafers 74 disposed on the spindle and with the shutter 18 in the operative position shown in solid lines, so that ring 52 closely surrounds the peripheral surface of carrier 40. Heater 42 is actuated to bring the wafer carrier and wafers to the desired temperature, and gas inlet element 22 is actuated to discharge treatment gases, while rotary drive 36 is actuated to spin the spindle 34 and wafer carrier 40 about central axis 14. The gas discharged by gas inlet element 22 passes generally as indicated by flow arrows F in FIG. 1. Thus, the gas passes downstream from the inlet element towards the carrier location and flows generally radially outwardly over the top or upstream surface of carrier 40. The flowing gas passes outwardly beyond the periphery of the wafer carrier and over ring 52, and then passes downwardly through the gap 62 between the ring and the interior wall surface defined by shutter 18. Although a minor amount of the gas passes downwardly through gap 70, this minor amount does not substantially influence the flow dynamics of the system. Preferably, less than about 5% of the gas passing over the top surface of the wafer carrier passes through gap 70, and the remainder passes through gap 62, out-board of the ring 52. The gas continues to flow downstream towards exhaust manifold 26 and passes into the exhaust manifold and out from the system through exhaust system 32.

As best seen in FIG. 2, the gas flowing outwardly over top surface 64 of the wafer carrier and over the surfaces of the wafers 74 forms a boundary layer B. Within this boundary layer, the gas flow streamlines are nearly parallel to the top surface of the carrier, so that the boundary layer has a substantially uniform thickness. However, as the gas approaches the gap 62, the streamlines converge appreciably in a region R, and the thickness of the boundary layer decreases appreciably within this region. However, this region is disposed over the ring 52 and not over the wafer carrier. Therefore, the boundary layer maintains a substantially uniform thickness over substantially the entire top surface of the wafer carrier. This provides a substantially even reaction rate over surfaces of wafers 74, even when the wafers 74 are disposed immediately adjacent the peripheral surface 66 of the carrier.

After processing, shutter 18 is moved to the open 18' configuration. Ring 52 moves with the shutter to the position shown at 52' in FIG. 1. When the shutter is in the retracted position, both the ring and the shutter are remote from opening 16 and do not impede movement of wafer carriers into and out of the chamber.

FIG. 4 depicts a system identical to the system shown in FIG. 2, but without ring 52, and using a typical wafer carrier having an appreciable radius at the juncture between the top surface of the carrier and the peripheral surface of the carrier. In this system, the gas passes downstream immediately outside the peripheral surface 66 of the wafer carrier. Thus, the streamlines converge appreciably over the outer portion of the wafer carrier itself. The region R of uneven boundary layer thickness extends inwardly from the peripheral surface 66 of the wafer carrier and covers a significant portion of the carrier top surface. Thus, if parts of wafers 74 are positioned within the area of the carrier covered by region R, these wafers will be subjected to uneven growth rates. Thus, in a system without ring 52, the wafer-holding pockets typically would be positioned differently, so as to keep them further away from the periphery of the carrier. This, in turn, would reduce the capacity of the wafer carrier. Stated another way, the presence of ring 52 (FIGS. 1-3) allows placement of the wafer carrier pockets close to the periphery of the carrier and thus increases the capacity of the carriers. This increases the throughput of the system, i.e., the number of wafers which can be processed per unit time.

Moreover, placing wafers closer to the periphery of the carrier promotes efficient use of the treatment gases. These gases typically are expensive, high-purity materials. Typically, the amount of each gas is determined so as to provide a constant amount per unit area over the entire area of the wafer carrier. By placing wafers closer to the periphery of the carrier, more of the area of the carrier can be covered by wafers, and more of the gas will be used to treat wafers.

The effect of the change in flow dynamics introduced by addition of ring 52 is further shown in FIG. 5. Curve 100 in FIG. 5 represents a calculated plot of thickness versus radial position in a chemical vapor deposition process using the reactor depicted in FIG. 4, with no ring and with a wafer carrier having a radiused edge. Curve 102 is a similar plot of calculated deposition thickness in the same chemical vapor deposition process using a reactor as shown in FIGS. 1-3, with ring 52 and with a wafer carrier having a sharp edge at its periphery. The thickness of the deposited layer is stated as normalized thickness, i.e., a ratio of the thickness at each radial position to the thickness at a radial position 190 mm from the center line. In each case, the wafer carrier has a diameter of 465 mm, so that the peripheral surface of the wafer carrier is disposed at a radial distance of 232.5 mm from the central axis. The vertical line 104 at approximately 223 mm radial distance from the center line represents the radial location of the outer-most points of wafers on the carrier if the carrier is configured to accommodate 54 wafers each having a diameter of two inches. Vertical line 106 at approximately 127 mm radial distance represents the radial location of the outer-most points on the wafers if the carrier is arranged to accommodate 6 six-inch diameter wafers. Curve 100 for the conventional reactor of FIG. 4 shows that, at line 104, the normalized thickness is in excess of 1.1. By comparison, curve 102 indicates a normalized thickness of approximately 1.02 at line 104. Stated another way, if the wafer carrier is arranged to accommodate 54 two-inch diameter wafers, the system without the ring will yield wafers having some points with thickness approximately 12% greater than other points on the same wafers, whereas the system with the ring will yield wafers with deposited layers of substantially thickness uniform to within about 2%. Further, if the wafer carrier is configured to hold 6 six-inch diameter wafers, the system without the ring will yield wafers having deposited layer thickness variations in excess of 40%, i.e., a normalized thickness of 1.4 at vertical line 106. By contrast, curve 102 indicates a thickness variation of approximately 7% at line 106, still within acceptable limits for many applications. Therefore, the system with the ring can be more readily used to process 6 six-inch wafers, using a wafer carrier of the same diameter as the system without the ring.

Figure 7:
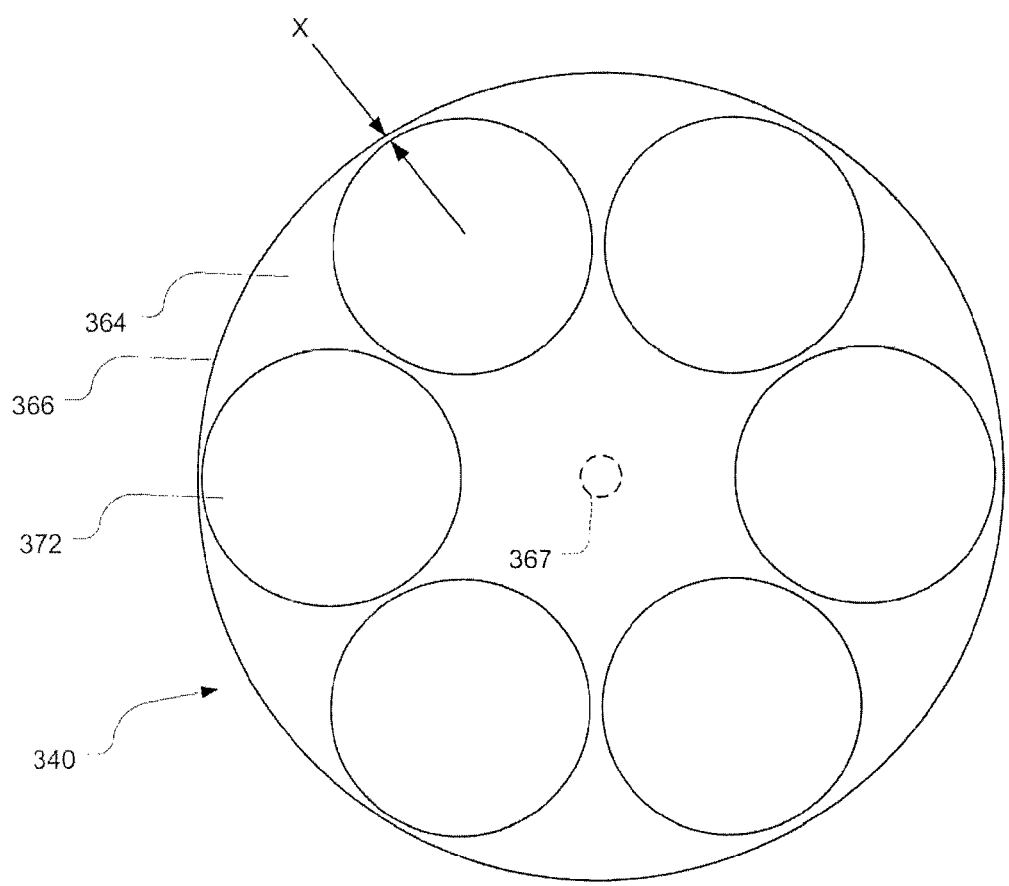
FIG. 7 is a diagrammatic top view of a wafer carrier according to a further embodiment of the invention.

Thus, the improvement afforded by the ring allows construction of a wafer carrier having pockets close to the periphery of the carrier, while still providing uniform treatment of the wafers. The wafer carrier 340 depicted in FIG. 7 has a circular body with a generally planar top surface 364 and a peripheral surface 366. The body has a fitting 367 adapted to mate with the spindle of a processing apparatus, such as the spindle 34 of the processing apparatus shown in FIG. 1. The fitting can be of any configuration; for a spindle having a conical fitting 38 as depicted in FIG. 1, the fitting of the carrier typically is a conical opening in the bottom of the body. The wafer carrier has wafer-holding elements in the form of pockets 372, each adapted to hold a wafer. Each of the pockets 372 lies close to the peripheral surface 366. Thus, the distance X between the outermost part of each pocket and the peripheral surface 366 is less than about 5 mm. Placement of the pockets so close to the peripheral surface has not been acceptable heretofore due to uneven thickness. The distance between the pocket and the peripheral surface is measured between the pocket and the edge where the top surface joins the peripheral surface. The body of carrier 340 may have any diameter, but desirably has a diameter greater than 300 mm. In one example, the carrier has a diameter of about 465 mm and has six pockets as depicted in FIG. 7, each pocket being adapted to hold one six-inch diameter wafer. The carrier may include a greater number of smaller-diameter pockets, and the pockets may be arranged with only some of the pockets disposed at the outside of the body, near the peripheral surface.

Ring 52 also acts as a thermal barrier between the periphery of the wafer carrier and the adjacent wall surface of the chamber defined by shutter 18. Typically, the wafer carrier is maintained at a temperature substantially higher than the walls of the reactor. For example, the wafer carrier may be maintained at a temperature on the order of 1000-1200° C. or higher, whereas the walls of the reactor may be maintained at temperatures below 100° C. There is significant radiant heat transfer between the edge of the wafer carrier and the adjacent wall surface. This tends to make the edge region of the wafer carrier cooler than other regions of the wafer carrier, and thus makes the wafers in the edge region cooler as well. Such non-uniform temperature distribution can result in non-uniform rates of reaction and non-uniform composition of a deposited layer. Although this effect can be counteracted to some degree by configuring the heater 42 to apply more heat to the region of the wafer carrier near the periphery, it is desirable to reduce this effect. Ring 52 acts as a radiation barrier and blocks direct radiation from the peripheral surface of the wafer carrier to the wall surface of the chamber defined by shutter 18. This helps to maintain a uniform temperature distribution over the wafer carrier, which in turn, promotes uniformity of process conditions over all portions of the wafers.

To further enhance the insulating effect of the ring, ring 52 may be provided with additional features which help to minimize heat conduction between the interior and exterior surfaces of the ring. For example, as seen in FIG. 6, ring 152 has a cross-sectional shape generally in the form of an inverted U, with a hollow interior space 153. The hollow interior space reduces heat conduction between interior surface 158 and peripheral, or exterior, surface 156. Preferably, the top or upstream surface 154 of the ring remains as a continuous, unbroken surface. Space 153 may be open on its downstream end, as depicted in FIG. 6, or may be closed on its downstream end. By reducing heat conduction between surfaces 158 and 156, the ring depicted in FIG. 6 further impedes heat transfer between the wafer carrier 40 and shutter 18.

In a further variant, ring 52 can be formed from a plurality of concentric rings, each of which may be formed from the same material or from different materials. For example, the concentric rings can be formed from refractory materials, such as graphite, silicon carbide, and/or silicon coated graphite, as well as refractory metals, such as molybdenum, rhenium, tungsten, niobium, tantalum, and alloys thereof. The size and number of concentric rings, as well as the materials that make up the ring 52, can be varied or adjusted depending upon the type of reactor and/or reactions that take place within the reactor. In yet another variant, the ring 52 may incorporate a heater, such as an electrical resistance heater. For example, where the ring is formed as a composite of multiple rings, one or more of the multiple rings may constitute a heating element. In one variant, the ring closest to the peripheral surface 66 of the wafer carrier 40 may be the heating element. Heating of the ring can be used to control the temperature of the wafer carrier edge. The heater incorporated in the ring can be controlled by a feedback control system (not shown), which is sensitive to the temperature of the wafer carrier 40 near the edge as, for example, a control system using one or more pyrometers to monitor the wafer carrier temperature. The dimensions of rings according to these and other variants can be selected as discussed above in connection with ring 52, (FIGS. 1 and 2). Thus, here again the ring desirably is as wide as practicable and desirably provides the minimum practicable clearance around the wafer carrier so as to minimize the size of the gap between the wafer carrier and the ring.

Figure 8:
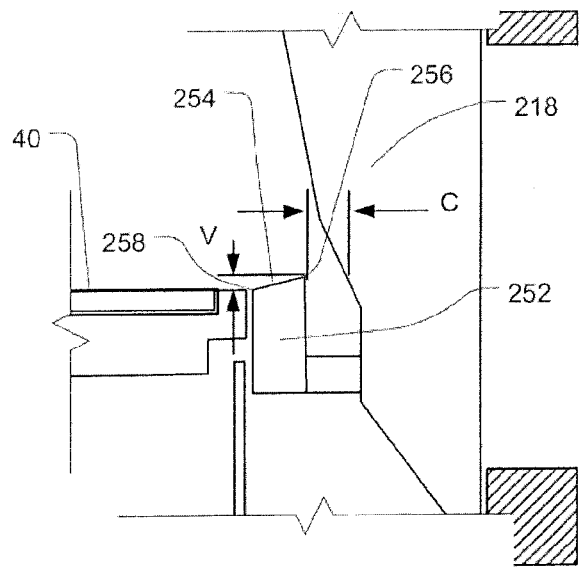
FIG. 8 is a view similar to FIG. 2, but depicting a portion of apparatus according to yet another embodiment of the invention.

The apparatus depicted in FIG. 8 is similar to that depicted in FIG. 1, except that the ring 252 has an upstream or top surface 254 in the form of a portion of a cone concentric with the central axis. Surface 254 slopes upwardly in the radially outward direction, away from the central axis of the chamber. Stated another way, the juncture between the upstream or top surface 254 and the outer peripheral surface 256 lies upstream of the juncture between the upstream surface 254 and the interior surface 258 of the ring. The vertical rise V of the top surface between interior surface 258 and exterior surface 256 desirably is between about 1-2 mm. This upward slope helps to further suppress convergence of streamlines in the region over the ring and over the peripheral region of wafer carrier 40. The shutter 218 may be modified slightly from that shown in the other figures so as provide the same clearance C between the ring and the nearest portion of the shutter or wall structure. In a further variant, an upwardly sloping top surface may be provided as a surface of revolution of a curved generatrix about the central axis. Thus, in this embodiment, the upstream or top surface would not define a straight line, but instead would define an upwardly sloping curved line.

Top surface 254 may alternatively slope downward in the radially outward direction, i.e., away from the central axis of the chamber. In yet another variation, upstream or top surface 254 may be hemispherical in shape or may be planar with ridges or ripples of various shapes across the surface.

Other embodiments may include a wafer carrier 40, which itself may have a lip projecting upwardly around the periphery of the top surface of the wafer carrier. Wafer carriers having upwardly-sloping lips are described in U.S. Patent Application Publication No. 2011/0215071, the disclosure of which is hereby incorporated by reference herein. In these embodiments, the upwardly-sloping lip of the wafer carrier may be combined with an upwardly-sloping surface 254 of the ring 252, as hereinbefore disclosed. Such surfaces may be arranged so that, when the wafer carrier is mounted at the carrier location, the upwardly-sloping surface of the carrier lip and the ring 252 are nearly continuous with one another and cooperatively define a composite upwardly-sloping surface. These upwardly-sloping surfaces may provide further control of deposition rates near the edge of the wafer carrier.

In a variant of the arrangements discussed above, structures such as rollers and guide pins (not shown) can be mounted to ring 52 (FIGS. 1 and 2) or to baffle 44 to provide further assurance against contact between wafer carrier 40 and ring 52. Baffle 44 can also be further modified to include bumps or ridges on the wall proximate to the rollers to assist in the alignment of ring 52 with the top or upstream surface 64 of the carrier 40. In some instances, it may be desirable to have the top or upstream surface of ring 52 higher or lower than the top or upstream surface 64 of the carrier 40. In other instances, it may be desirable to have interior surface 58 of ring 52 higher or lower than the top or upstream surface of ring 52. This can be accomplished, for example, by having the rollers located within baffle 44 resting on the aforementioned bumps or ridges.

In the embodiments discussed above, the ring is mounted to the shutter. However, this is not essential. For example, the ring can be mounted on a separate actuator, and can be moved independently of the shutter. In still other embodiments, the wall structure of the reactor may not include a shutter. In this case, the ring is disposed between the location of the wafer carrier and the fixed wall structure of the reactor. In the embodiments discussed above, the ring is movable relative to the fixed wall structure of the reactor, either with the shutter or independently, so that the ring can be moved out of the way during loading and unloading of wafer carriers from the chamber. However, this is not essential. If the configuration of the wafer carriers and the configuration of the elements used to move the wafer carriers into and out of the reactor permit, the wafer carriers can be installed and removed without moving the ring.

During CVD processes, often times film growth will occur on the reaction chamber parts in addition to the intended substrate surface. If not cleaned, the additional film growth on the reactor chamber parts will affect the efficiency of the CVD process, resulting in lower than expected yields as well as additional maintenance on the reactor chamber. One way to remove the additional film growth on ring 52 is to heat ring 52 to a temperature which will flash heat off the additional film growth. A heater configured for such purposes can be incorporated into the ring 52, as described above.

Yet another method may be to cause vibration of ring 52. This can be accomplished by raising and lowering ring 52 simultaneously causing the rollers in baffle 44 to roll over the bumps or ridges located thereon. Vibration can also be accomplished by attaching an ultrasonic transducer to the ring 52 (or a supporting element thereof).

Yet another method to clean the additional film growth from the ring or the shutter (for example, shutter 18) is to provide for one or more orifices in the shutter wall facing the interior of the reactor chamber and/or the top surface of the ring, thus allowing non-reactive gas to flow through the orifice(s) and blast the additional film growth off the respective surfaces.

Figure 9:
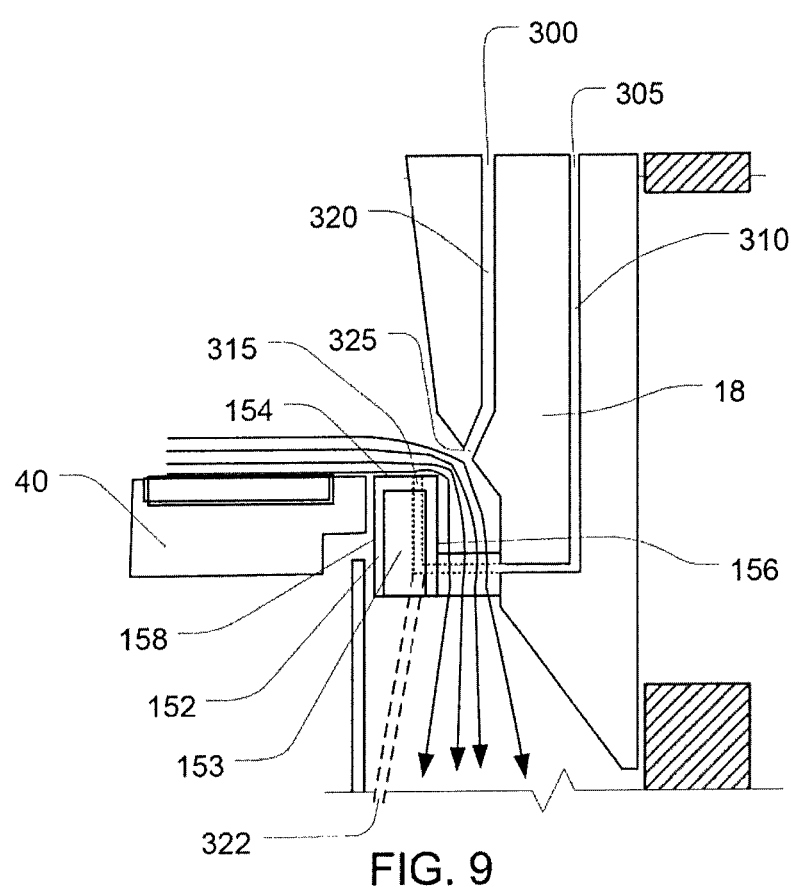
FIG. 9 is a view similar to FIG. 6, but depicting a portion of apparatus according to yet another embodiment of the invention.

As shown in FIG. 9 (where, with the exception of reference numerals 300, 305, 310, 315, 320, and 325, the reference numerals are as described above), gas inlet 300 may feed gas through gas tube 320 which connects to and supplies the gas to orifice 325. In this variant, orifice 325 may also exit through the wall of the shutter 18. Moreover, as noted, one or more orifices 325 can be placed along various positions of the wall of the shutter 18, such orifice(s) 325 facing the interior of the reaction chamber.

A separate gas inlet 305 may also feed gas through gas tube 310, which connects to and supplies the gas to orifice 315. However, in this variant, unlike orifice 325, orifice 315 may exit through the top or upstream surface 154 of ring 152. As with above, one or more orifices 315 can be placed within the top or upstream surface 154. Additionally, the orifice(s) 315 can take the shape of a continuous or semi-continuous slit around the circumference of the ring 152.

Orifices 315 and 325 can be used to clean the additional film growth on the ring (or other surfaces) in sequential or simultaneous activation. Gases suitable for use include, for example, $H_2$, $N_2$, Ar, and other inert gases. The gas(es) can be introduced into the reactor at a temperature ranging from about room temperature up to about 1600° C.

An alternate variation to orifices 315, 325 as set forth above, would be to have a gas tube 322 (shown in dotted lines in FIG. 9) extend through the base plate of the reactor. Gas tube 322, in this embodiment, may be a flexible bellows tube and may serve to clean the additional film growth from the ring 152 and/or the shutter 18 in a similar manner to orifices 315, 325.

Another use for the one or more orifices 315 in ring 152, besides cleaning, may be for passing purge gas through the orifice(s) 315 on ring 152 during the growth process. In so doing, one may be able to adjust the height of the boundary layer in the localized region of the purge gas by adjusting the flow rate of the gas, which may be used to compensate for any height variations caused by installing the ring 152. That is, if a "taller" flow extender (ring 152) is required, i.e., one that projects above the top planar surface 154 of the wafer carrier, a higher gas flow rate may be used to push purge gas through the one or more orifices 315 on ring 152. Conversely, if a boundary layer closer to the "z" plane of the wafer carrier is desired, the gas flow rate may be decreased. By being able to adjust the efficiency of ring 152 by raising or lowering the gas flow rate through orifice(s) 315 to adjust the boundary layer, tool-to-tool matching is made simpler by eliminating precise height adjustments during installation of ring 152 into MOCVD systems.

For variants of ring 152 in which the ring is formed from a plurality of concentric rings, the rings may expand at different rates during operation, depending on whether or not the rings are formed of different materials. This effect may cause the additional film growth discussed above to become dislodged from the upstream or top surface of the ring(s).

Figure 10:
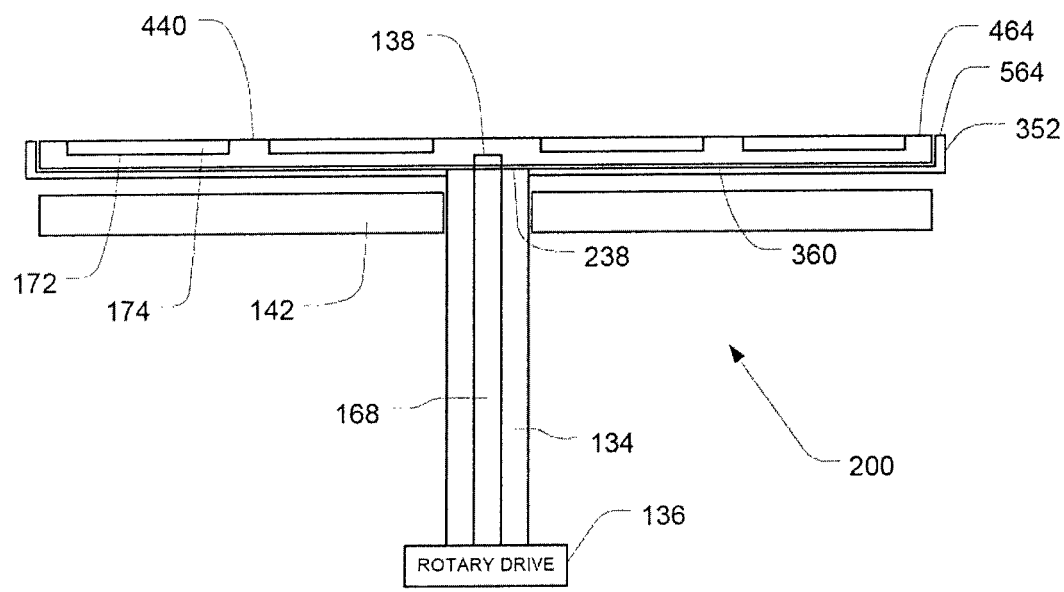
FIG. 10 is a diagrammatic view of apparatus according to yet another embodiment of the invention.

In the embodiments discussed above, the ring, while in the operative position, also remains stationary during processing of the wafers. In other embodiments, the ring can be rotated around the central axis during processing. For example, the ring may be mounted to a spindle so that the ring can be rotated around the central axis during processing by a separate rotary drive. A diagrammatic view of this embodiment is shown in FIG. 10. The ring may rotate in the same direction as the wafer carrier and spindle, or in the opposite direction.

As shown in FIG. 10, assembly 200 has an outer spindle 134 and an inner spindle 168, which are connected to a rotary drive mechanism 136. Inner spindle 168 may have a fitting 138 at its upstream end. The fitting may be arranged to releasably engage and hold a wafer carrier 440 at a carrier location similar to that depicted in FIG. 1. Wafer carrier 440 may include numerous pockets 172, each of which is arranged to hold a wafer 174 so that the top surface of the wafer is substantially coplanar with top surface 464 of wafer carrier 440. Outer spindle 134 may also have a fitting 238 at its upstream end. The fitting may be arranged to engage (in other embodiments, releasably engage) support 360 to which ring 352 is mounted. The rotary drive 136 is designed to allow for independent rotation of inner spindle 168 and outer spindle 134, permitting the wafer carrier to rotate in the same direction as the ring, in opposite directions, or to allow the ring to remain stationary as the wafer carrier rotates.

Support 360 may take many shapes. In some instances, support 360 may be a susceptor or may be a series of support arms which extend radially from outer spindle 134 to just beyond the outer edge of wafer carrier 464, at which point ring 352 is mounted on the support arms. Support 360 may be made from any suitable material capable of withstanding the high temperatures inside the reaction chamber of an MOCVD reactor and, at the same time, permit appropriate heat transfer from heater 142 to wafer carrier 440. Heater 142 of assembly 200 may be mounted and configured in a manner like heater 42 described hereinabove.

Figure 11:
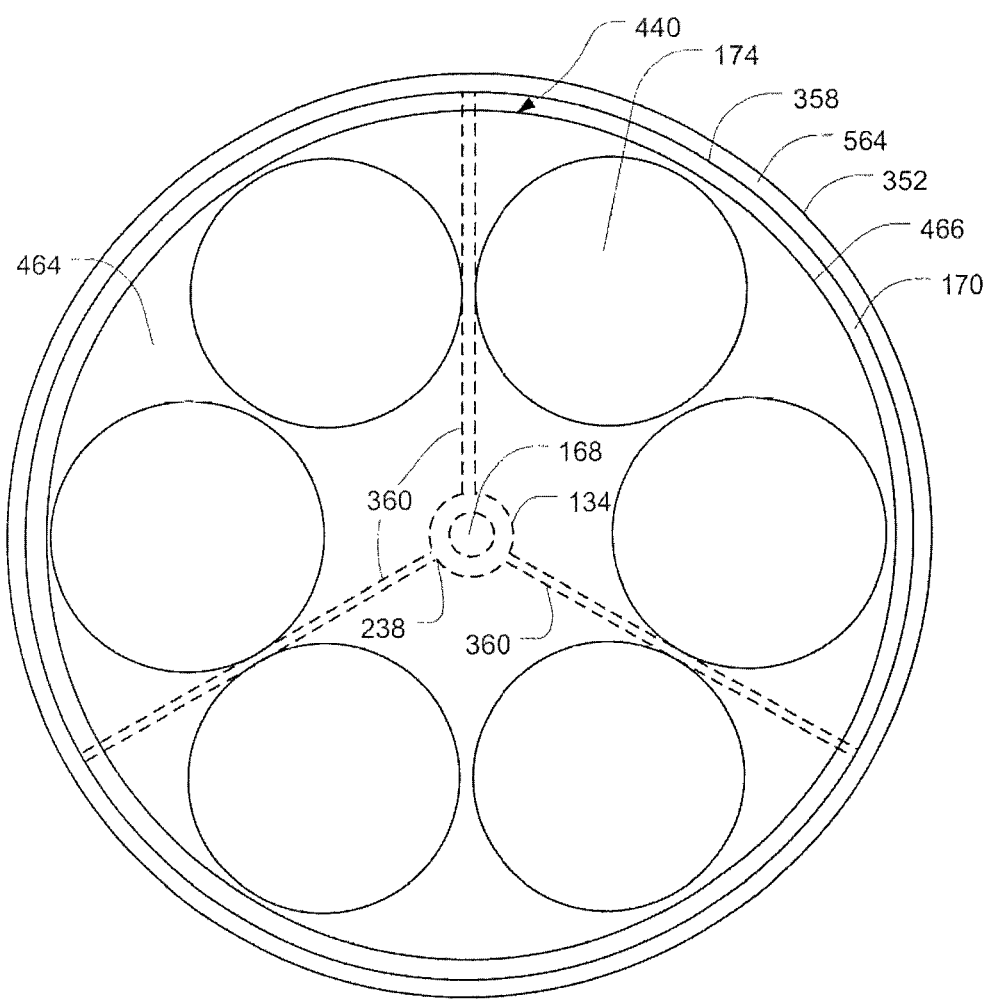
FIG. 11 is a top plan view of the assembly of FIG. 10.

FIG. 11 shows a top plan view of assembly 200 of FIG. 10, with support 360 shown in phantom lines. Gap 170 between the peripheral edge 466 of wafer carrier 440 and interior surface 358 of ring 352 is similar in size to that of gap 70 described previously.

Additionally, rotary drive 136 may, apart from permitting rotation of ring 352, allow for separate height adjustments of top surface 464 of wafer carrier 440 in relation to top surface 564 of ring 352. For some growth process steps, it may be beneficial to have top surface 464 of wafer carrier 440 essentially coplanar with top surface 564 of ring 352. In other growth process steps, it may be beneficial to have top surface 464 of wafer carrier 440 higher or lower than top surface 564 of ring 352. Ring 352 can also take the shape and characteristics of ring 252 as described above.

In yet another embodiment, the ring may be disposed within the chamber and arranged to releasably engage the outer edge of the wafer carrier so that the ring, in effect, becomes a temporary part of the wafer carrier during operation.

The materials of construction of the reactor elements, and the composition of the treatment gasses, may be conventional. For example, the wafer carrier may be formed in whole or in part from refractory materials such as graphite, silicon carbide, and silicon carbide coated graphite, whereas elements such as the ring may be formed of similar materials or from refractory metals such as molybdenum. Metals used for the ring optionally may be blackened to increase the emissivity of the metal. The treatment gasses may be, for example, gasses selected to react in a chemical vapor deposition reaction or gasses selected to etch or otherwise treat the surfaces of the wafers.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

We claim:

1. A method of processing wafers comprising the steps of:
   (a) positioning a wafer carrier inside a reaction chamber so that a ring within the chamber surrounds the carrier, so that top surfaces of the carrier and ring facing in an upstream direction are substantially continuous with one another and so that surfaces of wafers disposed on the carrier face in the upstream direction; and
   (b) directing one or more treatment gasses in a downstream direction opposite to the upstream direction onto the top surfaces of the wafer carrier and wafers while rotating the wafer carrier and wafers around an upstream-to-downstream axis, so that the treatment gasses flow outwardly over the top surface of the carrier and the surfaces of the wafer, and flow outwardly from the top surface of the carrier over the top surface of the ring.

2. A method as claimed in claim 1 further comprising exhausting gasses from the chamber downstream from the ring so that the gasses flowing outwardly over the top surface of the ring pass downstream within a gap between the ring and a wall of the chamber.

3. A method as claimed in claim 2 further comprising removing the wafer carrier from the chamber after the directing step, and repeating the aforesaid steps with another wafer carrier having new wafers disposed thereon.

4. A method as claimed in claim 3 further comprising moving the ring upstream or downstream after the directing step and before the step of removing the carrier.

5. A method as claimed in claim 4 wherein the step of moving the ring after the directing step includes moving a shutter mechanically connected to the ring from an operative position to an open position in which the shutter does not occlude an opening in the chamber wall, and the step of removing the wafer carrier includes removing the carrier from the chamber through the opening while the carrier is in the open position.

6. A method as claimed in claim 5 wherein the shutter and the ring cooperatively define the gap when the shutter and ring are in the operative position.

7. A method as claimed in claim 1 further comprising the step of heating the wafer carrier, wherein the ring acts to impede heat transfer from the wafer carrier to the wall of the chamber.

8. A method of processing wafers comprising the steps of:
   (a) positioning a wafer carrier inside a reaction chamber so that a ring within the chamber surrounds the carrier, so that top surfaces of the carrier and ring facing in an upstream direction are substantially continuous with one another and so that surfaces of wafers disposed on the carrier face in the upstream direction; and
   (b) directing one or more treatment gasses in a downstream direction opposite to the upstream direction onto the top surfaces of the wafer carrier and wafers while rotating the wafer carrier and wafers around an upstream-to-downstream axis, so that the treatment gasses flow outwardly over the top surface of the carrier and the surfaces of the wafers, and flow outwardly from the top surface of the carrier over the top surface of the ring,
   (c) exhausting gasses from the chamber downstream from the ring so that the treatment gasses flowing outwardly over the top surface of the ring bend around a peripheral edge of the ring to change direction to the downstream direction, wherein the treatment gasses form a laminar boundary layer flowing outwardly over the top surface of the carrier and over the top surface of the ring, the boundary layer maintaining a substantially uniform thickness over the top surfaces of all of the wafers disposed on the carrier.

9. A method as claimed in claim 8 wherein the ring does not rotate about the upstream-to-downstream axis while the wafer carrier is rotating around the upstream-to-downstream axis.

10. A method as claimed in claim 8 wherein the ring is rotationally fixed relative to an interior wall of the reaction chamber.

11. A method as claimed in claim 8 wherein the wafers are not rotated relative to the wafer carrier the wafer carrier is rotating around the upstream-to-downstream axis.

12. A method as claimed in claim 8 wherein the boundary layer maintains the substantially uniform thickness over substantially the entire top surface of the wafer carrier.

* * * * *